United States Patent
Le et al.

(10) Patent No.: US 11,867,307 B1
(45) Date of Patent: Jan. 9, 2024

(54) MULTI-PIECE SLIT VALVE GATE

(71) Applicant: APPLIED MATERIALS, INC., Santa Clara, CA (US)

(72) Inventors: Shawn Thanhson Le, San Jose, CA (US); Peter Reimer, Mountain View, CA (US); Ofer Amir, Half Moon Bay, CA (US); Hannie Thi Vo, Milpitas, CA (US)

(73) Assignee: Applied Materials, Inc., Santa Clara, CA (US)

(*) Notice: Subject to any disclaimer, the term of this patent is extended or adjusted under 35 U.S.C. 154(b) by 0 days.

(21) Appl. No.: 17/876,035

(22) Filed: Jul. 28, 2022

(51) Int. Cl.
| | |
|---|---|
| *F16K 1/46* | (2006.01) |
| *F16K 3/02* | (2006.01) |
| *F16K 3/314* | (2006.01) |
| *F16K 25/00* | (2006.01) |
| *H01J 37/32* | (2006.01) |

(52) U.S. Cl.
CPC .......... *F16K 3/0227* (2013.01); *F16K 1/46* (2013.01); *F16K 3/314* (2013.01); *F16K 25/00* (2013.01); *H01J 37/32458* (2013.01)

(58) Field of Classification Search
CPC ........ F16K 3/0227; F16K 3/314; F16K 51/02; F16K 1/46; F16K 25/00; H01J 37/32458; Y10T 137/7036
USPC ............... 251/326, 328–329, 357; 137/375; 277/529–530
See application file for complete search history.

(56) References Cited

U.S. PATENT DOCUMENTS

| | | | | | |
|---|---|---|---|---|---|
| 1,645,785 | A * | 10/1927 | Wilson | ...... | F16K 3/12 29/890.124 |
| 4,474,358 | A * | 10/1984 | Bennett | ...... | F16K 1/46 251/900 |
| 5,013,009 | A * | 5/1991 | Nelson | ...... | F16K 3/12 251/328 |
| 5,579,718 | A * | 12/1996 | Freerks | ...... | F16K 51/02 118/733 |
| 6,796,545 | B2 * | 9/2004 | Enzaki | ...... | F16K 25/00 251/363 |
| 6,932,354 | B2 * | 8/2005 | Kane | ...... | F16J 15/061 277/637 |
| 7,306,237 | B2 * | 12/2007 | Tsuji | ...... | F16J 15/062 277/644 |

(Continued)

FOREIGN PATENT DOCUMENTS

| | | |
|---|---|---|
| CN | 109643629 A | 4/2019 |
| EP | 1179835 A2 | 2/2002 |

(Continued)

OTHER PUBLICATIONS

International Search Report and Written Opinion for International Application No. PCT/US/2023/28705, dated Nov. 3, 2023, 10 Pages.

*Primary Examiner* — John Bastianelli
(74) *Attorney, Agent, or Firm* — Lowenstein Sandler LLP

(57) ABSTRACT

Disclosed is a slit valve gate. The slit valve gate includes a base portion configured to couple to a slit valve actuator. The slit valve gate further includes a seal portion coupled to the base portion. The seal portion is configured to create an airtight seal between the slit valve gate and a sealing surface of a slit valve opening. The slit valve gate further includes a clamp portion coupled to the base portion. The clamp portion retains the seal portion at least partially between the clamp portion and the base portion.

20 Claims, 5 Drawing Sheets

(56) References Cited

U.S. PATENT DOCUMENTS

| | | | | |
|---|---|---|---|---|
| 7,862,002 B2* | 1/2011 | Naitoh | ................ | F16K 31/1221 |
| | | | | 251/63.5 |
| 8,459,305 B2* | 6/2013 | Sutliff | ................... | F16K 1/2261 |
| | | | | 138/44 |
| 2011/0095218 A1* | 4/2011 | Schoch | ................... | F16K 51/02 |
| | | | | 251/157 |
| 2013/0068391 A1 | 3/2013 | Mazzocco et al. | | |
| 2017/0351275 A1* | 12/2017 | Ito | .......................... | F16K 51/02 |

FOREIGN PATENT DOCUMENTS

| | | |
|---|---|---|
| WO | 2017132002 A1 | 8/2017 |
| WO | 2017132205 A1 | 8/2017 |

\* cited by examiner

500

Coupling a seal portion of a slit valve gate to a base portion of the slit valve gate.
510

Coupling a clamp portion of the slit valve gate to the base portion.
520

Depositing a protective coating on one or more of the base portion or the clamp portion.
530

MULTI-PIECE SLIT VALVE GATE

FIELD OF THE DISCLOSURE

Embodiments of the present disclosure relate generally to the field of substrate processing systems and specifically to a multi-piece slit valve gate.

BACKGROUND OF THE DISCLOSURE

Substrates are commonly processed in vacuum processing systems. These systems include one or more chambers, each performing substrate processing operations such as etching, chemical vapor deposition or physical vapor deposition, which can include heating or cooling of the substrate, and a plasma to assist the process. Typically, the environment within such processing chambers is maintained at a low sub-atmospheric pressure. Each chamber includes inlets and outlets for an evacuation apparatus and the admission of processing gases, as well as an aperture controlled by a slit valve to admit substrates. Such processing chambers may be in communication with a substrate transfer chamber, and the substrate transfer chamber may also have a valve-controlled aperture through which substrates can be admitted from outside the system.

The slit valves that open and close the apertures are typically housed within ports that are positioned between adjacent chambers. The ports typically house at least one gate that is coupled to an actuator used to manipulate it. The actuators can be pneumatic actuators that include one or more pistons for moving the gate from an open position (where the gate is not isolating one chamber from the adjacent chamber and the aperture is open) to a closed position (where the gate is isolating one chamber from the adjacent chamber and the aperture is closed) and vice versa.

SUMMARY OF THE DISCLOSURE

In certain embodiments, the instant disclosure is directed to a slit valve gate including a base portion configured to couple to a slit valve actuator. The slit valve gate further includes a seal portion coupled to the base portion. The seal portion is configured to create an airtight seal between the slit valve gate and a sealing surface of a slit valve opening. The slit valve gate further includes a clamp portion coupled to the base portion. The clamp portion retains the seal portion at least partially between the clamp portion and the base portion.

In certain embodiments, the instant disclosure is directed to a slit valve including a slit valve opening and a slit valve actuator. The slit valve further includes a slit valve gate coupled to the slit valve actuator. The slit valve gate is configured to seal the slit valve opening responsive to the slit valve actuator moving the slit valve gate to a closed position. The slit valve gate includes a base portion. The slit valve gate is coupled to the slit valve actuator via the base portion. The slit valve gate further includes a seal portion coupled to the base portion. The seal portion is configured to create an airtight seal between the slit valve gate and a sealing surface of the slit valve opening responsive to the slit valve actuator moving the slit valve gate to the closed position. The slit valve gate further includes a clamp portion coupled to the base portion. The clamp portion retains the seal portion at least partially between the clamp portion and the base portion.

In certain embodiments, the instant disclosure is directed to a method. The method includes coupling a seal portion of a slit valve gate to a base portion of the slit valve gate. The seal portion is configured to create an airtight seal between the slit valve gate and a sealing surface of a slit valve opening. The method further includes coupling a clamp portion of the slit valve gate to the base portion. The coupling of the clamp portion to the base portion causes the clamp portion to retain the seal portion at least partially between the clamp portion and the base portion.

BRIEF DESCRIPTION OF THE DRAWINGS

The present disclosure is illustrated by way of example, and not by way of limitation, in the figures of the accompanying drawings in which like references indicate similar elements. It should be noted that different references to "an" or "one" embodiment in this disclosure are not necessarily to the same embodiment, and such references mean at least one.

DETAILED DESCRIPTION

Figure 1:
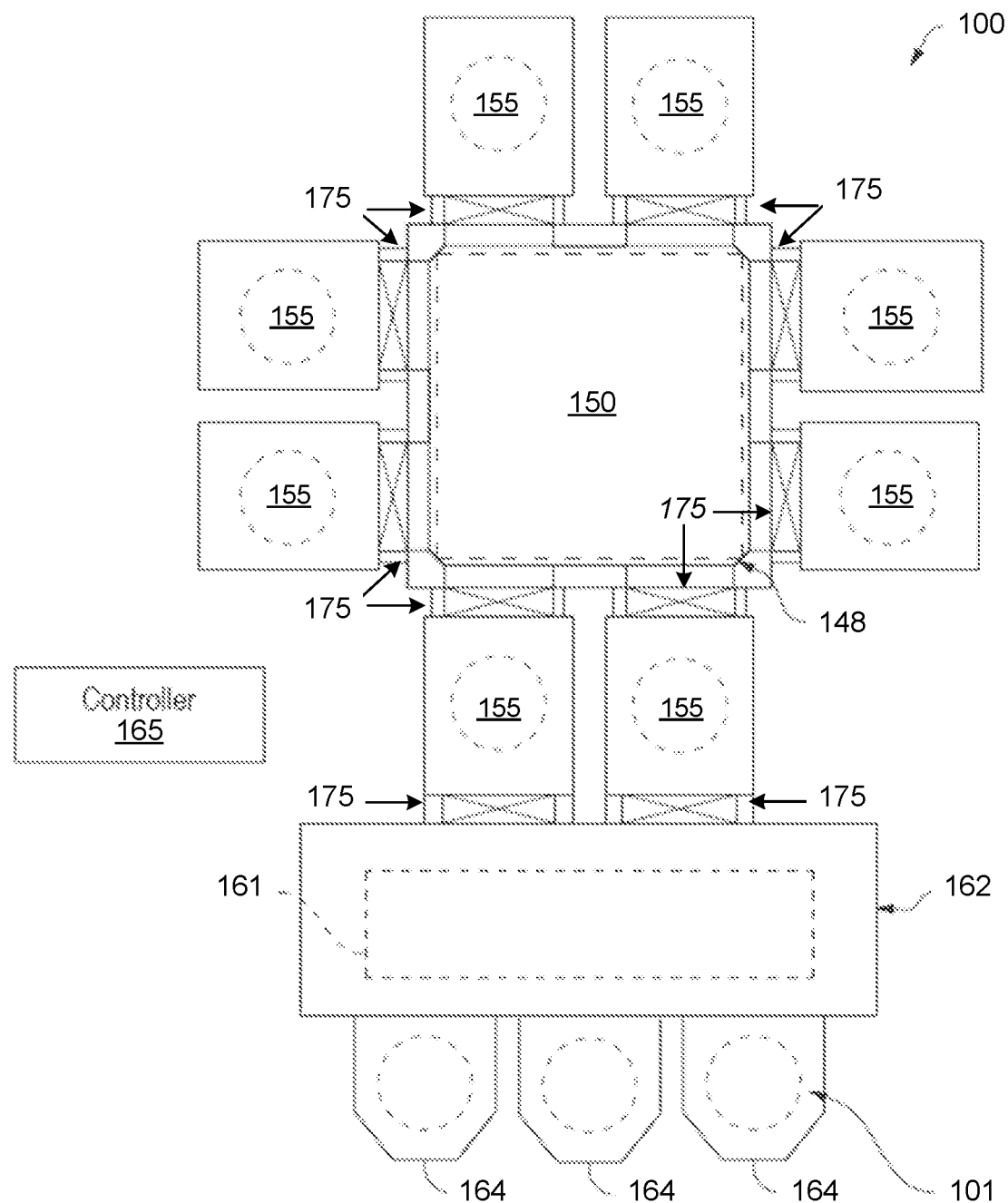
FIG. 1 illustrates a top schematic of a wafer processing system in accordance with embodiments of the present disclosure.

Semiconductor substrates and other substrates are commonly processed in vacuum processing systems and are transferred between one or more chambers through apertures controlled by slit valves assemblies. These slit valve assemblies typically include at least one gate coupled to an actuator used to manipulate the gate. The actuators can be full stroke pneumatic actuators that include one or more pistons for moving the gate from an open position (where the gate is not isolating one chamber from the adjacent chamber) to a closed position (where the gate is isolating one chamber from the adjacent chamber) and vice versa. Other types of actuators may also be used.

Slit valve assemblies typically include a seal that is bonded to a base portion of the gate. Conventionally, the seal is over-molded to the base portion. The seal of conventional slit valve gates thus cannot be easily replaced. When the seal of a conventional slit valve gate fails, the entire gate assembly is replaced. Additionally, because of the over-molded nature of conventional slit valve gate seals, adding a protective coating to the slit valve gate is difficult. For example, to apply a protective coating to a conventional slit valve gate, the sealing surface of the bonded seal is masked. Masking the bonded seal adds complexity and expense to the process of manufacturing the slit valve gate.

The instant disclosure is related to a multi-piece slit valve gate including a base portion, a seal portion, and a clamp portion. In some embodiments, the slit valve gate is configured to couple to a slit valve actuator via the base portion.

A seal portion of the slit valve gate (e.g., a seal, an elastomer seal, etc.) is coupled to the base portion. When the actuator moves the slit valve gate to a closed position (e.g., moves the slit valve gate to cover and seal the slit valve opening), the seal is configured to create an airtight seal between the slit valve gate and a slit valve opening. The seal thus is to seal off the slit valve opening. The seal is retained in the base portion by the clamp portion. The clamp portion is coupled to the base portion (e.g., by one or more mechanical fasteners). The seal is retained between the clamp portion and the base portion. In some embodiments, the clamp portion includes a flange that retains the seal in a groove formed by the clamp portion and the base portion.

By providing the multi-piece slit valve gate of the present disclosure, many advances can be realized. For example, the multiple pieces (e.g., the base portion, the clamp portion, etc.) of the slit valve gate described herein can be individually coated with a protective coating, unlike conventional slit valve gates. This allows a protective coating to be applied to the components of the slit valve gate that can optimize resistance to harmful gasses or environment to which the slit valve gate is exposed. The protective coating can be applied without the masking used for coating conventional slit valve gates. Additionally, the seal portion (e.g., the seal) of the slit valve gate described herein is capable of individual replacement (e.g., the seal can be replaced without replacing a remainder of the slit valve gate), unlike the seal of conventional slit valve gates. This allows for less equipment down time and less expense when compared to conventional slit valve gates. Furthermore, the slit valve gate described herein may provide increased sealing capabilities when compared to conventional slit valve gates. As an example, the multi-piece slit valve gate may better protect against contaminant ingress or egress at least in part because the seal portion can be replaced as soon as it begins to degrade, providing a better environment for substrate processing and reducing material consumption (e.g., gas, etc.) when compared to conventional slit valve gates.

FIG. 1 illustrates a top schematic of a substrate processing system 100 in accordance with embodiments of the present disclosure. Substrate processing system 100 may include a factory interface 162 (also referred to as "equipment front end module (EFEM)"), a main frame 150 (also referred to as a transfer chamber), one or more processing chambers 155, and one or more load lock chambers 156 according to embodiments described herein. Main frame 150 may be connected to factory interface 162 via the one or more load lock chambers 156. Substrate carriers 164 may be detachably connected to a front wall of the factory interface 162. Factory interface 162 may include a factory interface robot 161 for moving substrate 101 (shown dotted for illustration purposes) and/or other objects (such as process kit ring, etc.) between substrate carriers 164 and load lock chambers 156. For instance, factory interface 162 may include one or more load ports, each of which may receive a substrate carrier 164. An overhead track (OHT) may drop a front opening unified pod (FOUP) onto a load port. Factory interface robot 161 may pick substrate 101 from the FOUP and may optionally align substrate 101 in an aligner (not shown). Subsequently, factory interface robot 161 may place substrate 101 in load lock chamber 156. Thereafter, main frame robot 150 (located in main frame 150) may pick substrate 101 from at least one of load lock chambers 156 and hand substrate 101 to at least one of the one or more processing chambers 155.

As the manufacturing processes progress, the factory interface robot 161 and the main frame robot 150, working in tandem, may move substrates 101 and/or other objects between the substrate carriers 164 and the processing chambers 155. Various electronic device fabrication processes, e.g., semiconductor device manufacturing processes, such as, e.g., oxidation, thin film deposition, etching, heat treatment, degassing, cool down, etc., may take place within process chambers 155.

After processing in at least one of the one or more processing chambers 155 is complete, processed substrate 101 may be picked by main frame robot 150 and handed over to at least one of load lock chambers 156. At least one of load lock chambers 156 may pump its pressure up to atmospheric pressure followed by the processed substrate 101 being picked by the factory interface robot 161 and placed back into the FOUP. After all substrates from substrate carriers 164 are processed, the OHT (not shown) may pick the FOUP and drop it with a different tool as per the designed manufacturing process.

Substrate 101 and/or other objects are transferred between one station to an adjacent station (e.g., between main frame 150 to processing chamber 155, between load lock chamber 156 and main frame 150, between factory interface 162 and load lock chamber 156, and the like) via at least one gate that is a part of a slit valve assembly that may be housed in ports 175. A slit valve assembly according to certain embodiments is described in further detail with respect to FIG. 2. Each slit valve (or gate) is able to transition from a closed position to an open position and vice versa. In the closed position, the slit valve (or gate) isolates one station from an adjacent station. In the open position, the slit valve (or gate) does not isolate one station from the adjacent station and objects are transferable from one station to an adjacent station through the open apertures of two opposing sides of ports 175. The slit valve may include a multi-piece gate (e.g., the gate may include a seal portion coupled to a base portion) as described in some embodiments herein.

As used herein, the term "station" refers to a chamber in which objects that are transferred through a wafer processing system, such as a wafers, may be stored temporarily. A station, as used herein, may be separated from other portions of the substrate processing system with at least one gate.

Figure 2:
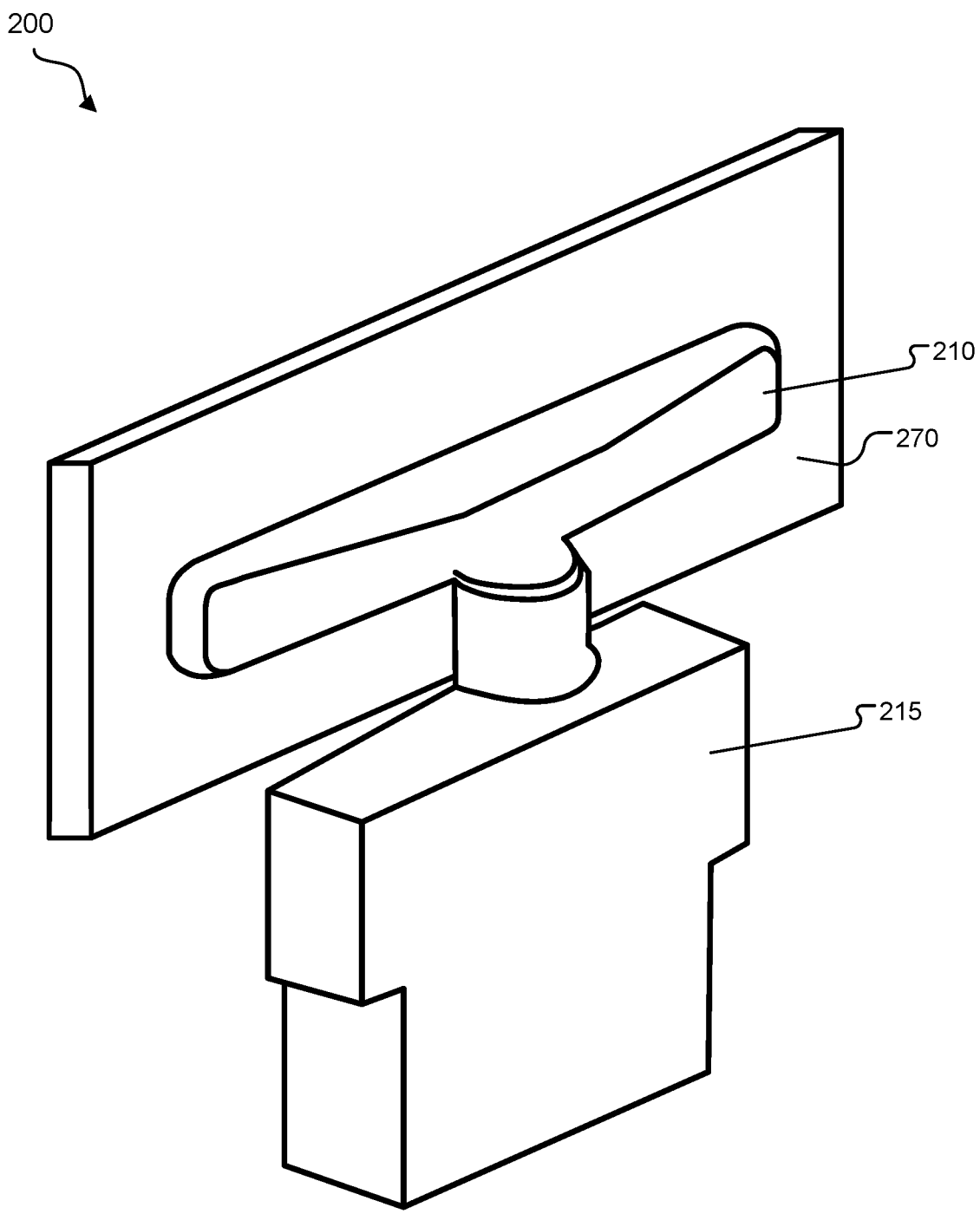
FIG. 2 illustrates a simplified perspective view of a slit valve apparatus in accordance with embodiments of the present disclosure.

FIG. 2 illustrates a simplified perspective view of a slit valve apparatus in accordance with embodiments of the present disclosure. The slit valve apparatus may include a slit valve assembly 200 that may be housed in port 175 depicted in FIG. 1. In certain embodiments, the slit valve apparatus includes a plurality of slit valve assemblies, each of the slit valve assemblies housed in one of ports 175.

In some embodiments, the slit valve assembly 200 includes at least one gate 210 configured to transition between an open position and a closed position (e.g., as shown in FIG. 2). Slit valve assembly 200 may further include a slit valve control mechanism that includes at least one actuator 215 coupled to the gate 210 via a movable member. The actuator 215 may be configured to exert force on the gate 210. In some embodiments, the actuator 215 is a pneumatic actuator configured to pneumatically move gate 210 from an open position to a closed position or vice versa. In some embodiments, the actuator 215 is an electric actuator, a mechanical actuator, or other type of actuator.

While in the closed position (e.g., as shown in FIG. 2), the slit valve gate 210 may seal an opening formed in surface 270. The opening formed in surface 270 may be a slit valve opening as described herein. A seal portion of the gate 210 may interface with a sealing surface of the surface 270 to create an airtight seal. In some embodiments, the seal portion may elastically deform when the actuator 215 moves the gate 210 to the closed position. The elastic deformation of the seal portion may create the airtight seal described herein. The airtight seal may guard against contaminants or gasses from passing through the slit valve opening.

Figure 3A:
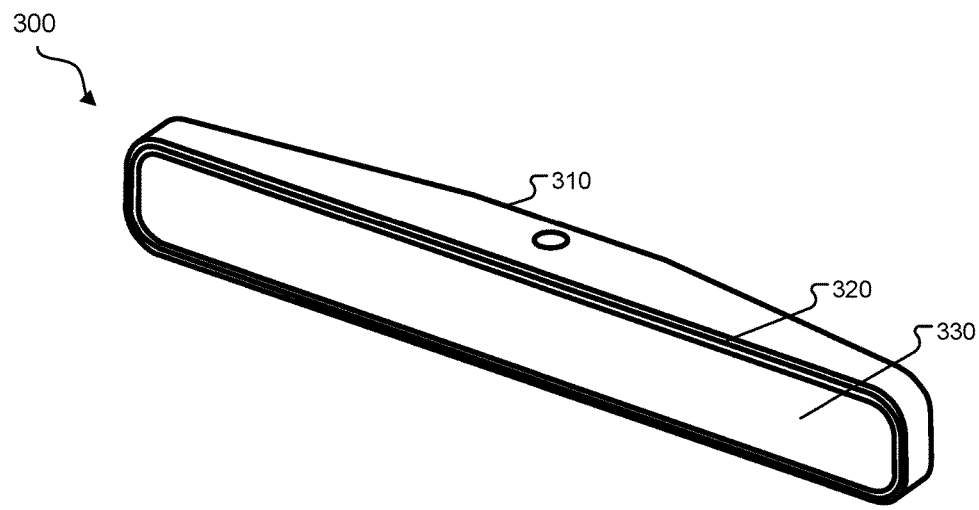
FIG. 3A illustrates a simplified perspective of a slit valve gate in accordance with embodiments of the present disclosure.
Figure 3B:
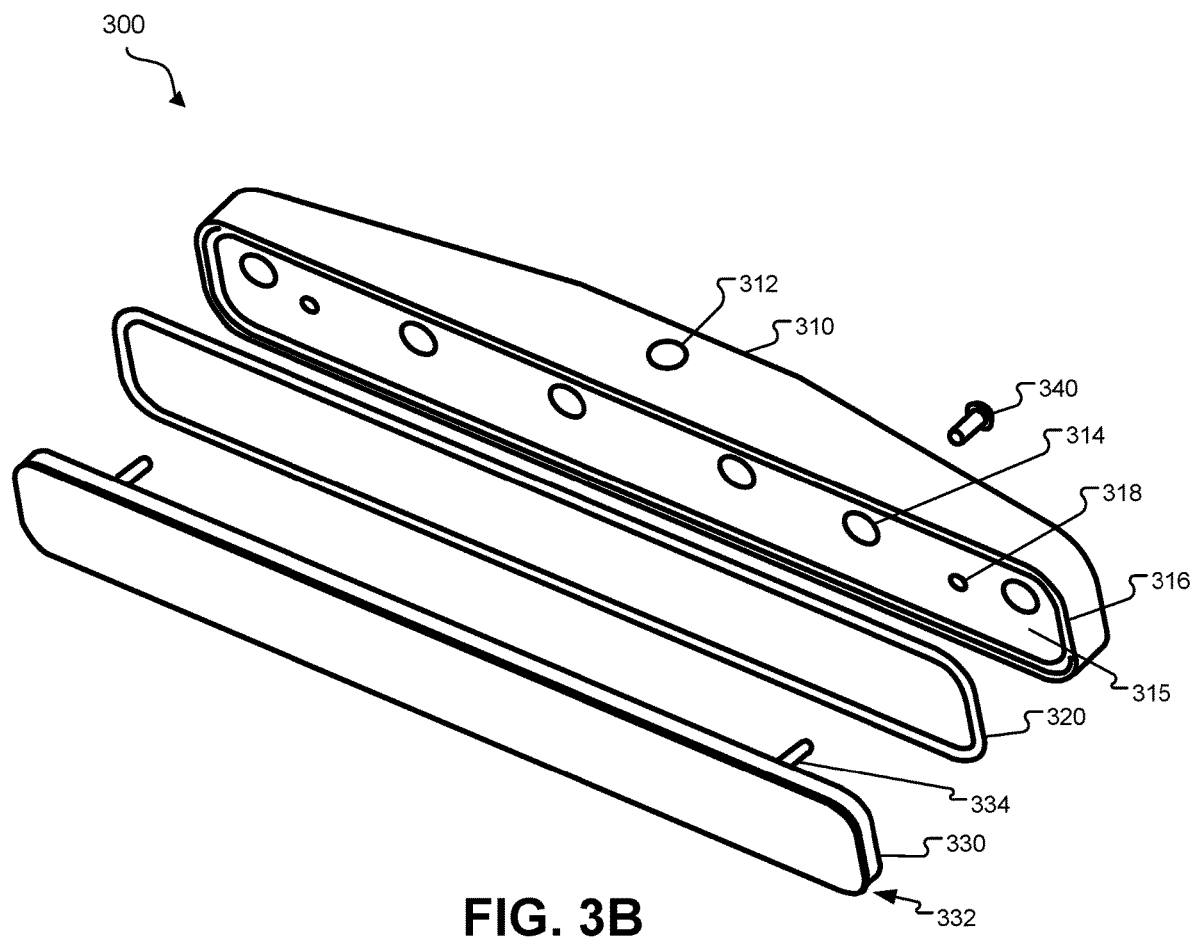
FIG. 3B illustrates a simplified perspective view of a disassembled slit valve gate in accordance with embodiments of the present disclosure.

FIG. 3A illustrates a simplified perspective view of a slit valve gate 300 in accordance with embodiments of the present disclosure. FIG. 3B illustrates a simplified perspective view of a disassembled slit valve gate 300 in accordance with embodiments of the present disclosure. In some embodiments, the slit valve gate 300 includes a base portion 310, a seal portion 320 (e.g., a seal), and/or a clamp portion 330. In many embodiments, the slit valve gate 300 is configured to couple to a slit valve actuator (e.g., actuator 215 of FIG. 2). In some examples, the base portion 310 may be configured to couple to an actuator (e.g., directly or indirectly via a movable member) via a mounting interface 312. In some embodiments, the mounting interface 312 is or includes a hole and/or recess formed in the base portion 310.

The base portion may include a lip 316 around a recess 315. The recess 315 may be configured to accept the clamp portion 330. In some embodiments, the base portion 310 forms multiple holes 314 through which fasteners 340 may pass to secure (e.g., fasten, etc.) the clamp portion 330 to the base portion 310. In some embodiments, each of the holes 314 are surrounded by a seal (e.g., an o-ring seal) to seal the holes 314. The clamp portion 330 may form corresponding holes (e.g., corresponding to holes 314) to receive fasteners 340. In some embodiments, the clamp portion 330 couples to the base portion 310 via one or more fasteners 340. In some embodiments, fastener 340 is a screw, a bolt, or another threaded fastener. In certain embodiments, the clamp portion 330 couples to the base portion 310 by a welded joint, a soldered joint, and/or a brazed joint.

In some embodiments, the base portion 310 forms an alignment recess 318 to receive a corresponding alignment pin 334 of the clamp portion 330. In some embodiments, the clamp portion 330 includes one or more alignment pins 334 protruding from a surface of the clamp portion 330. In some examples, the clamp portion 330 includes a first alignment pin 334 proximate a first distal end and a second alignment pin 334 proximate a second distal end. The alignment pin 334 and the alignment recess 318 may serve to align the clamp portion 330 relative to the base portion 310 as the clamp portion 330 is coupled to the base portion 310. Each of the alignment pins 334 may fit into a corresponding recess (e.g., alignment recess 318) formed in the base portion 310. In other embodiments, the base portion 310 may include one or more alignment pins, and the clamp portion 330 may include one or more recesses that align with the alignment pins to align the clamp portion to the base portion.

In some embodiments, the clamp portion 330 is configured to retain the seal portion 320. A flange 332 (e.g., of the clamp portion 330) and the lip 316 (e.g., of the base portion 310) may retain the seal portion 320. The flange 332 may extend from a surface of the clamp portion 330 around an outer periphery of the clamp portion 330. In some embodiments, the flange 332 and the lip 316 may substantially form a groove to retain the seal portion 320 when the clamp portion 330 is coupled to the base portion 310. In some embodiments, the lip 316 and the flange 332 together form a dovetail groove, as described herein below. In other embodiments, the lip 316 and flange 332 may together form a groove having other cross-sectional shapes, such as an inverted T-shaped groove, an L-shaped groove, a hemispherical groove, a circular groove, and so on.

In some embodiments, the seal portion 320 is an elastomer seal. The seal portion 320 may be made of a material such as rubber, silicone, plastic, expanded foam, fluoroelastomer, or another suitable polymer and/or elastomer. The seal portion 320 may have a cross-sectional profile as described herein below (e.g., with reference to FIGS. 4A-4B). In some embodiments, the seal portion 320 may have a circular profile (e.g., similar to an o-ring). Alternatively, the seal portion 320 may have other cross-sectional profiles, such as an inverted T-shape, an L-shape, a hemispherical shape, a circular shape, and so on. In some embodiments, the seal portion 320 may be hollow (e.g., may form an inner cavity). Including an inner cavity within the seal portion 320 may cause the seal portion 320 to be more flexible when compared to seals that do not include an inner cavity (e.g., are solid). In some embodiments, the seal portion 320 may at least partially compress when pushed against a sealing surface (e.g., when an actuator moves the slit valve gate 300 to a closed position) and may form an airtight seal. In some embodiments, the seal portion 320 may substantially fill a groove (e.g., a dovetail groove) formed by the clamp portion 330 and the base portion 310.

In some embodiments, the base portion 310 and/or the clamp portion 330 are made of a material selected from a group including aluminum, steel alloy, stainless steel, nickel alloy, titanium, ceramic, and/or plastic. The base portion 310 and the clamp portion 330 may be made of dissimilar materials. In some examples, the base portion 310 may be made of aluminum while the clamp portion 330 is made of stainless steel. The material of the base portion 310 and/or the material of the clamp portion 330 may be selected based on a particular coating to be applied to each of the components and/or based on the environment each of the components may be exposed to (e.g., a corrosive environment, a plasma environment, etc.). The material of the base portion 310 and/or the material of the clamp portion 330 may be selected to have complimentary coefficients of thermal expansion. In some examples, the base portion 310 is made of a material having a similar (e.g., substantially similar) coefficient of thermal expansion of the material of the clamp portion 330. In some embodiments, at least one surface of the base portion 310 and/or at least one surface of the clamp portion 330 are polished. In some examples, a surface of the base portion 310 and/or a surface of the clamp portion is electro-polished.

In some embodiments, the base portion 310 and/or the clamp portion 330 include a coating (e.g., a protective coating). The coating may cover at least one surface of the base portion 310 and/or at least one surface of the clamp portion 330. In some embodiments, the coating is a corrosion-resistant protective coating and/or a plasma-resistant protective coating. In some embodiments, the coating is a nickel-plated coating, and/or an anodized coating. The coating may be an electro-plated coating. In some embodiments, the coating is an oxidation coating. The coating may be selectively applied to either the base portion 310 or the clamp portion 330. In some examples, the base portion 310 includes a first coating and the clamp portion 330 includes a second coating. The first coating may be different from the second coating, in some embodiments. The coating may be optimized for the environment in which the slit valve gate is to operate.

In some embodiments, the coating is deposited using, for example, a technique such as atomic layer deposition (ALD), ion assisted deposition (IAD), plasma spray (PS), low pressure plasma spray (LPPS), chemical vapor deposition (CVD), plasma spray chemical vapor deposition (PS-CVD), sputtering, combinations thereof, or other techniques or modifications thereof suitable for forming conformal coatings. In some embodiments, the coating comprises a ceramic material that is resistant to corrosion by process gases or reactive species. For example, in some embodiments, the coating may comprise a plasma-resistant ceramic coating comprising a rare-earth ceramic selected from $Y_2O_3$, $YZrO$, $Y_xZr_yO_z$, $YZrOF$, $Y_3Al_5O_{12}$, $Y_4Al_2O_9$, $YF_3$, $Y_xO_yF_z$, $YOF$, $Er_2O_3$, $Er_3Al_5O_{12}$, $ErF_3$, $E_xO_yF_z$, $ErOF$, $La_2O_3$, $Lu_2O_3$, $Sc_2O_3$, $ScF_3$, $ScOF$, $Gd_2O_3$, $Sm_2O_3$, $Dy_2O_3$, a $Y_2O_3$—$ZrO_2$ solid solution, a ceramic comprising $Y_2Al_4O_9$ and a $Y_2O_3$—$ZrO_2$ solid solution, an amorphous phase containing a mixture of $Al_2O_3$ and $Y_2O_3$, or combinations thereof.

In some embodiments, the coating comprises $Al_2O_3$. In one embodiment, the coating comprises $Al_2O_3$ deposited by atomic layer deposition (ALD).

In some embodiments, the coating is substantially uniform in thickness, conformal to the underlying surface that is being coated, porosity-free, has no cracks, acts as a diffusion barrier for metal contaminants, and has high purity (e.g., greater than about 99% purity, or greater than about 99.95% purity). In certain embodiments, ALD may be advantageously used to coat all dimensions of the sensor assembly. In some embodiments, the coating is resistant cracking and/or delamination at various temperatures (such as up to 350° C.).

In certain embodiments, the coating may have a uniform thickness with a thickness variation of less than about +/−20%, a thickness variation of less than about +/−10%, a thickness variation of less than about +/−5%, or a lower thickness variation when comparing the thickness of the coating in one location to the thickness of the coating in another location (or when comparing the thickness of the coating in one location as compared to the average thickness of the coating, or when assessing the standard deviation of the thickness of the coating across several locations).

In certain embodiments, the coating may be conformal to the underlying surface that is being coated, including underlying surface features and/or complex geometrical shapes and/or portions coated which have high aspect ratios. For instance, the coating may conformally and uniformly coat portion that have high aspect ratios, e.g., length:width (L:W) or length:diameter (L:D), ranging from about 2:1 to about 500:1, from about 5:1 to about 300:1, from about 10:1 to about 150:1, from about 15:1 to about 100:1, or from about 20:1 to about 50:1.

In certain embodiments, the coating may be very dense and have a very low porosity, such as, a porosity of less than about 1%, less than about 0.5%, less than about 0.1%, or porosity-free (porosity of 0%). In certain embodiments, the coating may have a crack free microstructure, hermetic, and have a high dielectric breakdown resistance.

In certain embodiments, the coating may be deposited at a low deposition temperature, e.g., a deposition temperature up to 350° C., which may allow its use with a wide variety of materials.

Figure 4B:
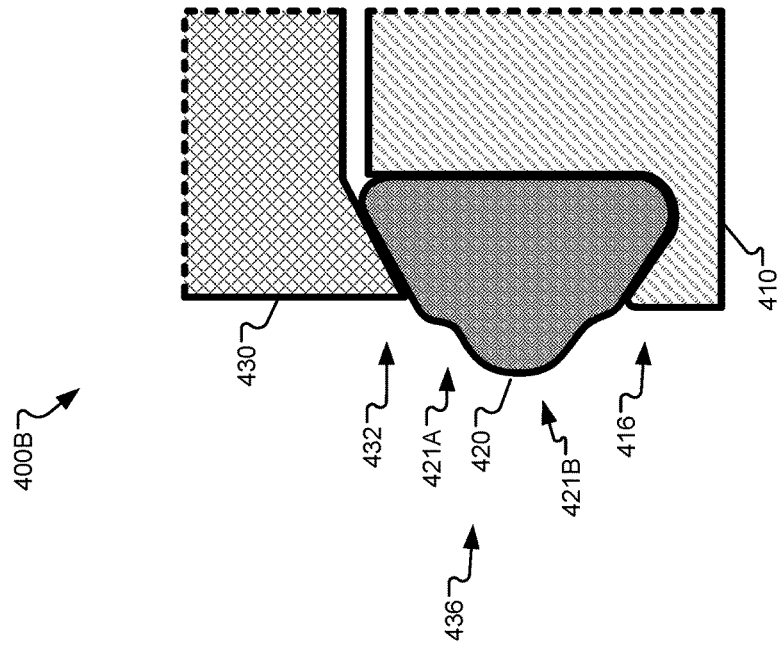
FIGS. 4A-4B illustrate cross-sectional views of a slit valve gate in accordance with embodiments of the present disclosure.
Figure 4A:
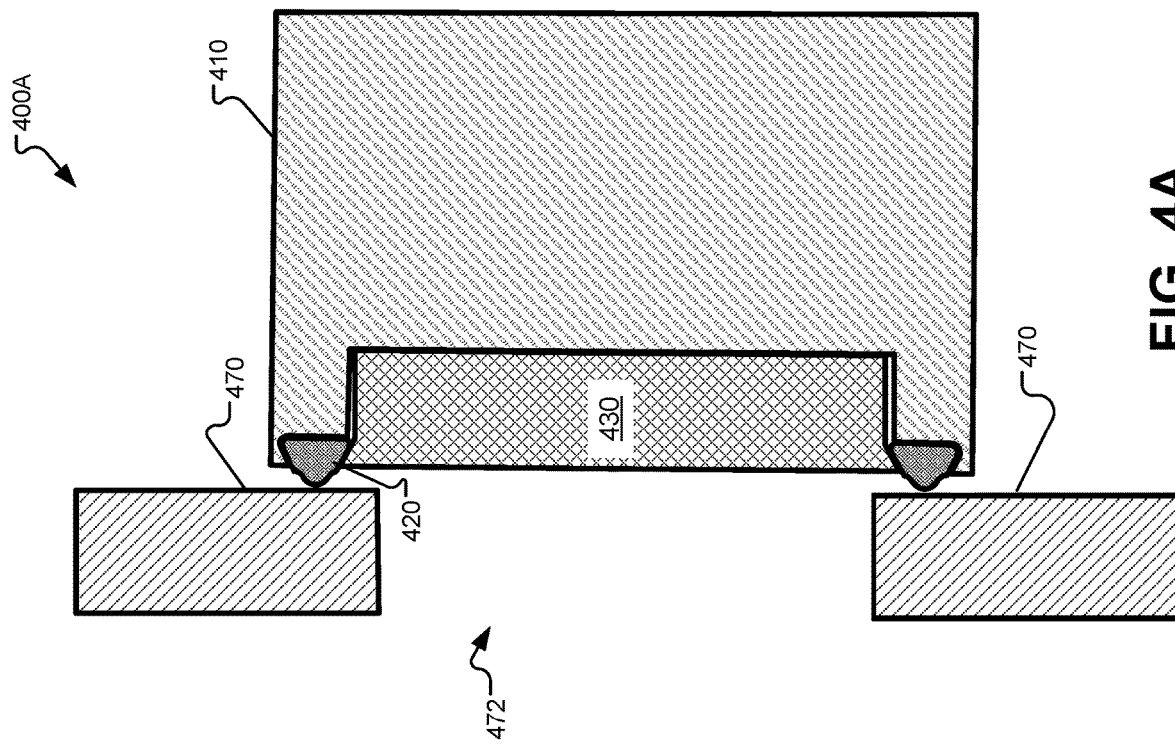

FIGS. 4A-4B illustrate cross-sectional views of a slit valve gate in accordance with embodiments of the present disclosure. FIG. 4A may illustrate a slit valve gate 400A in a closed position. FIG. 4B may illustrate a detailed view of a groove 436 of a slit valve gate 400B. Some of the features in FIGS. 4A-4B that have similar reference numbers as those in other figures may have similar properties, functions, and/or structures as those in FIGS. 4A-4B.

Referring to FIG. 4A, a clamp portion 430 and a base portion 410 of the slit valve gate 400A may retain a seal portion 420. The seal portion 420 may abut a sealing surface 470 that surrounds a slit valve opening 472 (e.g., when the slit valve gate 400A is in a closed position). The seal portion 420 may create an airtight seal responsive to the slit valve gate 400A being moved to a closed position (e.g., by an actuator). In some embodiments, the base portion 410 may correspond to base portion 310 of FIGS. 3A-3B, the seal portion 420 may correspond to seal portion 320 of FIGS. 3A-3B, and/or the clamp portion 430 may correspond to clamp portion 330 of FIGS. 3A-3B.

Referring to FIG. 4B, a flange 432 extending from a surface of the clamp portion 430 may, together with a lip 416 of the base portion 410, retain the seal portion 420 in a groove 436. In some embodiments, the clamp portion 430 together with the base portion 410 substantially form a groove (e.g., groove 436) when the clamp portion 430 is coupled to the base portion 410. In some examples, the base portion 410 forms a first part of the groove 436 and the clamp portion 430 forms a second part of the groove 436. In some examples, the flange 432 forms a part (e.g., a first wall) of the groove 436 and the lip 416 forms another part (e.g., an opposing second wall) of the groove 436. The groove 436 may be a dovetail groove, as illustrated in FIG. 4B and described herein, or may have another cross-sectional shape as described herein. The seal portion 420 may substantially conform to the groove 436.

In some embodiments, the seal portion 420 has an approximately trapezoidal cross-section. In some embodiments, the seal portion 420 has an approximately triangular cross-section. In some embodiments, the seal portion 420 has an approximately T-shaped cross-section. In some embodiments, the seal portion 420 has a circular (e.g., substantially circular) cross-section. The cross-section of the seal portion 420 may have substantially rounded corners. The cross-section of the seal portion 420 may include two shoulders 421A in some embodiments. A rounded portion 421B may protrude from the shoulders 421A. The rounded portion 421B may make contact with the sealing surface 470 when the slit valve gate is moved to a closed position. The seal portion 420 may substantially fill a groove formed by the base portion 410 and the clamp portion 430 (e.g., a groove formed by lip 416 and flange 432), and may include a portion that protrudes above the surface of the clamp portion 430. In some examples, the cross-sectional shape of the seal portion 420 conforms (e.g., substantially conforms) to the groove 436 formed by the base portion 410 and the clamp portion 430.

Figure 5:
FIG. 5 is a flow chart of a method of manufacturing a slit valve gate in accordance with embodiments of the present disclosure.
Figure 5:
Figure 5:

FIG. 5 is a flow chart of a method 500 of manufacturing a slit valve gate in accordance with embodiments of the present disclosure. In some embodiments, method 500 may be performed by machinery (e.g., assembly machinery, robotic machinery, etc.) and/or by a technician (e.g., a user, an engineer, an assembler, a human, etc.). In some embodiments, method 500 is performed and/or caused to be performed by processing logic that includes hardware (e.g., circuitry, dedicated logic, programmable logic, microcode, processing device, etc.), software (such as instructions run on a processing device, a general purpose computer system, or a dedicated machine), firmware, microcode, or a combination thereof.

For simplicity of explanation, method 500 is depicted and described as a series of operations. However, operations in accordance with this disclosure can occur in various orders and/or concurrently and with other operations not presented and described herein. Furthermore, in some embodiments, not all illustrated operations are performed to implement method 500 in accordance with the disclosed subject matter. In addition, those skilled in the art will understand and appreciate that method 500 could alternatively be represented as a series of interrelated states via a state diagram or events.

At block 510, a seal portion (e.g., a seal) of a slit valve gate is coupled to (or inserted into or placed against) a base portion of the slit valve gate (e.g., as described herein). The seal portion may correspond to seal portion 320 of FIGS. 3A-3B and/or seal portion 420 of FIGS. 4A-4B. In some embodiments, the seal is inserted into a groove (e.g., a part of a groove) formed by the base portion. In some examples, the seal may be inserted into a part of a dovetail groove formed by a lip (e.g., lip 316 of FIG. 3B) proximate an outer periphery of the base portion (e.g., base portion 310 of FIGS. 3A-4B). A surface of the base portion may be coated by a protective coating prior to coupling seal potion to the base portion.

At block 520, a clamp portion of the slit valve gate is coupled to the base portion. The clamp portion (e.g., clamp portion 330 of FIGS. 3A-3B) may be coupled to the base portion (e.g., base portion 310 of FIGS. 3A-3B) by one or more fasteners (e.g., fastener 340 of FIG. 3B). In some embodiments, the clamp portion may be coupled to the base portion by a joint such as a welded joint, a brazed joint, and/or a soldered joint. In some embodiments, the clamp portion is coupled to the base portion by an adhesive. In some embodiments, one or more alignment pins of the clamp portion (e.g., alignment pin 334 of FIG. 3B) are aligned with corresponding aligning holes (e.g., aligning holes 318 of FIG. 3B). In some embodiments, the clamp portion fits into a recess (e.g., recess 315 of FIG. 3B) formed in the base portion. A surface of the clamp portion may be coated by a protective coating prior to coupling the clamp portion to the base portion. Coupling the clamp portion to the base portion may secure the seal portion between a lip of the base portion and a lip of the clamp portion such that a part of the seal portion protrudes above the clamp portion, providing a seal surface.

At block 530, a protective coating may be deposited on one or more of the base portion or the clamp portion. In some embodiments, the protective coating is deposited prior to coupling the clamp portion to the base portion and/or prior to coupling the seal portion to the base portion.

Coatings (e.g., metal layers, electrode layers, dielectric layers, dielectric sleeves, etc.) according to embodiments described herein may be formed using a deposition process selected from chemical vapor deposition (CVD), plasma enhanced chemical vapor deposition (PECVD), physical vapor deposition (PVD), plasma enhanced physical vapor deposition (PEPVD) and atomic layer deposition (ALD). CVD is a well-known technique for depositing pure metal coatings. In a typical CVD process, a substrate is exposed to at least one volatile precursor under ultra-high vacuum conditions. The at least one precursor reacts or decomposes on the substrate surface to form a film. The reaction chamber is subsequently purged with inert gas flowing there-through. In a PECVD process, chemical reactions are initiated by the creation of a plasma of the reactive precursor gases. In an ALD process, a thin film layer is grown by repeatedly exposing the surface of a substrate to pulses of gaseous chemical precursors that chemically react with the surface one at a time in a self-limiting manner. CVD and ALD are non-line-of-sight processes that may be used to coat high aspect ratio features. A PVD process also takes place under vacuum conditions and typically involves sputtering and/or evaporation of a target material to form a gas that deposits and/or reacts on a surface of the substrate. PVD (typically, including evaporation, plasm spray, etc.) is a line-of-sight process. In a PEPVD process (typically, including ion assisted deposition, ion assisted evaporation deposition, ion assisted sputtering deposition, ion plating, etc.), the plasma or energetic ions are generated to react with deposition materials from the PVD processes, such as the ion beams, and involve sputtering or evaporation of target materials. PEPVD is a line-of-sight process, but can be modified as a non-line-of-sight process in cases where the substrate is biased during the deposition processes. As compared to ALD, PVD and PEPVD can deposit a relatively thick coating (up to about 500 μm, or up to about 250 μm, or from about 5 μm to about 250 μm) at a relatively low deposition temperature (<200° C.).

In some embodiments, the coating is deposited using one or more of ALD, IAD, LPPS, CVD, PS-CVD, or sputtering. In some embodiments, the coating comprises a rare-earth ceramic selected from $Y_2O_3$, YZrO, $Y_xZr_yO_z$, YZrOF, $Y_3Al_5O_{12}$, $Y_4Al_2O_9$, $YF_3$, $Y_xO_yF_z$, YOF, $Er_2O_3$, $Er_3Al_5O_{12}$, $ErF_3$, $Er_xO_yF_z$, ErOF, $La_2O_3$, $Lu_2O_3$, $Sc_2O_3$, $ScF_3$, ScOF, $Gd_2O_3$, $Sm_2O_3$, $Dy_2O_3$, a $Y_2O_3$—$ZrO_2$ solid solution, a ceramic comprising $Y_2Al_4O_9$ and a $Y_2O_3$—$ZrO_2$ solid solution, or combinations thereof. In some embodiments, the coating comprises $Al_2O_3$ In some embodiments, the coating comprises ALD deposited $Al_2O_3$ In some embodiments, the coating comprises multiple layers. In some embodiments, the coating has a thickness of about 10 nanometers to about 500 nanometers, or any sub-range or single value therein.

In the foregoing description, numerous specific details are set forth, such as specific materials, dimensions, processes parameters, etc., to provide a thorough understanding of the present disclosure. The particular features, structures, materials, or characteristics may be combined in any suitable manner in one or more embodiments. The words "example" or "exemplary" are used herein to mean serving as an example, instance, or illustration. Any aspect or design described herein as "example" or "exemplary" is not necessarily to be construed as preferred or advantageous over other aspects or designs. Rather, use of the words "example" or "exemplary" is simply intended to present concepts in a concrete fashion. As used in this application, the term "or" is intended to mean an inclusive "or" rather than an exclusive "or". That is, unless specified otherwise, or clear from context, "X includes A or B" is intended to mean any of the natural inclusive permutations. That is, if X includes A; X includes B; or X includes both A and B, then "X includes A or B" is satisfied under any of the foregoing instances. Reference throughout this specification to "an embodiment", "certain embodiments", or "one embodiment" means that a particular feature, structure, or characteristic described in connection with the embodiment is included in at least one embodiment. Thus, the appearances of the phrase "an embodiment", "certain embodiments", or "one embodiment" in various places throughout this specification are not necessarily all referring to the same embodiment.

Embodiments of the present disclosure have been described with reference to specific exemplary embodiments thereof. The specification and drawings are, accordingly, to be regarded in an illustrative rather than a restrictive sense. Various modifications of the disclosure in addition to those shown and described herein will become apparent to those skilled in the art and are intended to fall within the scope of the appended claims.

As used herein, the singular forms "a," "an," and "the" include plural references unless the context clearly indicates otherwise. Thus, for example, reference to "a wafer" includes a single wafer as well as two or more wafers, and the like.

As used herein, the term "about" in connection with a measured quantity, refers to the normal variations in that measured quantity, as expected by one of ordinary skill in the art in making the measurement and exercising a level of care commensurate with the objective of measurement and the precision of the measuring equipment. In certain embodiments, the term "about" includes the recited number ±10%, such that "about 10" would include from 9 to 11.

Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to illuminate certain materials and methods and does not pose a limitation on scope. No language in the specification should be construed as indicating any non-claimed element as essential to the practice of the disclosed materials and methods.

What is claimed is:

1. A slit valve gate comprising:
    a base portion configured to couple to a slit valve actuator;
    a seal portion coupled to the base portion, wherein the seal portion comprises a cross-sectional shape comprising a rounded portion protruding from a region between rounded shoulders, and wherein the seal portion is configured to create an airtight seal between the slit valve gate and a sealing surface of a slit valve opening; and
    a clamp portion coupled to the base portion, wherein the clamp portion retains the seal portion at least partially between the clamp portion and the base portion, and wherein the rounded shoulders and the rounded portion protrude above a first surface of the clamp portion and a second surface of the base portion.

2. The slit valve gate of claim 1 further comprising:
    a plurality of mechanical fasteners that secure the clamp portion to the base portion.

3. The slit valve gate of claim 1, wherein the clamp portion couples to the base portion by a weld joint, a solder joint, or a braze joint.

4. The slit valve gate of claim 1, wherein the clamp portion comprises a plurality of alignment pins protruding from a face of the clamp portion, and wherein the plurality of alignment pins fit into corresponding recesses formed in the base portion.

5. The slit valve gate of claim 1, wherein one or more of the base portion or the clamp portion comprise a material selected from a group consisting of aluminum, stainless steel, titanium, ceramic, and plastic.

6. The slit valve gate of claim 1, wherein one or more of the base portion or the clamp portion are coated with a protective coating.

7. The slit valve gate of claim 1, wherein the clamp portion comprises a flange around a periphery of the clamp portion, wherein the clamp portion and the base portion form a groove, and wherein the flange retains the seal portion at least partially in the groove.

8. The slit valve gate of claim 7, wherein the groove is a dovetail groove, and wherein a first portion of the dovetail groove is formed by the clamp portion and a second portion of the dovetail groove is formed by the base portion.

9. The slit valve gate of claim 8, wherein the cross-sectional shape of the seal portion conforms to the dovetail groove.

10. A slit valve comprising:
    a slit valve opening;
    a slit valve actuator; and
    a slit valve gate coupled to the slit valve actuator, wherein the slit valve gate is configured to seal the slit valve opening responsive to the slit valve actuator moving the slit valve gate to a closed position, wherein the slit valve gate comprises:
        a base portion, wherein the slit valve gate is coupled to the slit valve actuator via the base portion;
        a seal portion coupled to the base portion, wherein the seal portion comprises a cross-sectional shape comprising a rounded portion protruding from a region between rounded shoulders, and wherein the seal portion is configured to create an airtight seal between the slit valve gate and a sealing surface of the slit valve opening responsive to the slit valve actuator moving the slit valve gate to the closed position; and
        a clamp portion coupled to the base portion, wherein the clamp portion retains the seal portion at least partially between the clamp portion and the base portion and wherein the rounded shoulders and the rounded portion protrude above a first surface of the clamp portion and a second surface of the base portion.

11. The slit valve of claim 10 further comprising:
    a plurality of mechanical fasteners that secure the clamp portion to the base portion.

12. The slit valve of claim 10, wherein the clamp portion comprises an alignment pin protruding from a face of the clamp portion, and wherein the alignment pin fits into a corresponding recess formed in the base portion.

13. The slit valve of claim 10, wherein one or more of the base portion or the clamp portion comprise a material selected from a group consisting of aluminum, stainless steel, titanium, ceramic, or plastic.

14. The slit valve of claim 10, wherein one or more of the base portion or the clamp portion are coated with a protective coating.

15. The slit valve of claim 10, wherein the clamp portion comprises a flange around a periphery of the clamp portion, wherein the clamp portion and the base portion form a groove, and wherein the flange retains the seal portion at least partially in the groove.

16. The slit valve of claim 15, wherein the groove is a dovetail groove, and wherein a first portion of the dovetail groove is formed by the clamp portion and a second portion of the dovetail groove is formed by the base portion.

17. The slit valve of claim 16, wherein the cross-sectional shape of the seal portion conforms to the dovetail groove.

18. A method comprising:
    coupling a seal portion of a slit valve gate to a base portion of the slit valve gate, wherein the seal portion comprises a cross-sectional shape comprising a rounded portion protruding from a region between rounded shoulders, and wherein the seal portion is configured to create an airtight seal between the slit valve gate and a sealing surface of a slit valve opening; and
    coupling a clamp portion of the slit valve gate to the base portion, wherein the coupling of the clamp portion to the base portion causes the clamp portion to retain the seal portion at least partially between the clamp portion and the base portion, and wherein the rounded shoulders and the rounded portion protrude above a first surface of the clamp portion and a second surface of the base portion.

19. The method of claim 18 further comprising:
depositing a protective coating on one or more of the base portion or the clamp portion.

20. The method of claim 18, wherein the clamp portion comprises a flange around a periphery of the clamp portion, wherein the clamp portion and the base portion form a groove responsive to coupling the clamp portion to the base portion, and wherein the flange retains the seal portion at least partially in the groove responsive to coupling the clamp portion to the base portion.

\* \* \* \* \*